United States Patent
Franco et al.

(10) Patent No.: US 10,761,919 B2
(45) Date of Patent: Sep. 1, 2020

(54) SYSTEM AND METHOD TO CONTROL MEMORY FAILURE HANDLING ON DOUBLE-DATA RATE DUAL IN-LINE MEMORY MODULES

(71) Applicant: DELL PRODUCTS, LP, Round Rock, TX (US)

(72) Inventors: René Franco, Round Rock, TX (US); Amit S. Shah, Austin, TX (US); Tuyet-Huong Thi Nguyen, Cedar Park, TX (US); Vijay B. Nijhawan, Austin, TX (US); Vadhiraj Sankaranarayanan, Austin, TX (US); Mark L. Farley, Austin, TX (US); Andrew Butcher, Cedar Park, TX (US)

(73) Assignee: Dell Products, L.P., Round Rock ( * ) Notice: Subject to any disclaimer, the term of this patent is extended or adjusted under 35 U.S.C. 154(b) by 98 days.

(21) Appl. No.: 15/903,844

(22) Filed: Feb. 23, 2018

(65) Prior Publication Data
US 2019/0266036 A1    Aug. 29, 2019

(51) Int. Cl.
*G06F 11/07* (2006.01)
*G06F 3/06* (2006.01)
*G06F 11/10* (2006.01)
*G11C 16/00* (2006.01)

(52) U.S. Cl.
CPC ......... *G06F 11/076* (2013.01); *G06F 3/0619* (2013.01); *G06F 3/0653* (2013.01); *G06F 3/0673* (2013.01); *G06F 11/0727* (2013.01); *G06F 11/1048* (2013.01); *G11C 16/00* (2013.01)

(58) Field of Classification Search
CPC .... G06F 11/07; G06F 11/076; G06F 11/0727; G06F 11/1048
USPC ......................................... 714/47.2
See application file for complete search history.

(56) References Cited

U.S. PATENT DOCUMENTS

| | | |
|---|---|---|
| 7,099,943 B1 | 8/2006 | Tondering |
| 7,526,683 B1 | 4/2009 | Votta, Jr. et al. |
| 9,195,524 B1 | 11/2015 | Wiesner et al. |
| 2006/0080470 A1 | 4/2006 | Sollenberger et al. |
| 2009/0164872 A1* | 6/2009 | Chessin ............... G06F 11/008 714/765 |
| 2009/0327596 A1* | 12/2009 | Christenson ........ G06F 13/1684 711/105 |
| 2010/0257534 A1 | 10/2010 | Cismas et al. |
| 2013/0067156 A1* | 3/2013 | Cho ....................... G06F 13/28 711/105 |

(Continued)

*Primary Examiner* — Kamini B Patel
(74) *Attorney, Agent, or Firm* — Larson Newman, LLP

(57) ABSTRACT

An information handling system includes a processor, a dual in-line memory module (DIMM), and a memory controller coupled to the DIMM. The memory controller provides interrupts to the processor each time a read transaction from the DIMM results in a correctable read error. The processor instantiates a failure predictor to receive the interrupts, accumulate a count of the interrupts, and provide a first error indication when the count exceeds a first error threshold. The failure predictor increments the count each time the predictor receives a particular interrupt and decrements the count in accordance with an error leak rate. The error leak rate has a first value when the DIMM is newer than a first age threshold and has a second value when the DIMM is older than the first age threshold.

20 Claims, 13 Drawing Sheets

(56) References Cited

U.S. PATENT DOCUMENTS

| | | | |
|---|---|---|---|
| 2014/0119190 A1 | 5/2014 | Yin et al. | |
| 2014/0297975 A1* | 10/2014 | Ping | G06F 12/122 |
| | | | 711/156 |
| 2015/0281015 A1* | 10/2015 | Griffith | H04L 43/065 |
| | | | 709/224 |
| 2017/0132102 A1* | 5/2017 | Hirano | G06F 11/2215 |
| 2017/0147416 A1 | 5/2017 | Ranjan et al. | |
| 2017/0288705 A1* | 10/2017 | Li | H03M 13/2927 |
| 2018/0181307 A1* | 6/2018 | Oe | G06F 3/061 |
| 2018/0246775 A1* | 8/2018 | Sankaranarayanan | |
| | | | G06F 11/073 |
| 2019/0129777 A1* | 5/2019 | Rangarajan | G06F 11/1048 |
| 2019/0163557 A1* | 5/2019 | Nguyen | G11C 29/04 |
| 2019/0266037 A1* | 8/2019 | Shah | G06F 13/1668 |

\* cited by examiner

310

| Warning = 8   Leak Rate = 5 | | | |
|---|---|---|---|
| Sequence | Error | Count | Warning |
| 1 | 1 | 1 | 0 |
| 2 | 0 | 1 | 0 |
| 3 | 0 | 1 | 0 |
| 4 | 0 | 1 | 0 |
| 5 | 0 | 0 | 0 |
| 6 | 0 | 0 | 0 |
| 7 | 0 | 0 | 0 |
| 8 | 0 | 0 | 0 |
| 9 | 0 | 0 | 0 |
| 10 | 0 | 0 | 0 |
| 11 | 1 | 1 | 0 |
| 12 | 1 | 2 | 0 |
| 13 | 1 | 3 | 0 |
| 14 | 1 | 4 | 0 |
| 15 | 1 | 4 | 0 |
| 16 | 1 | 5 | 0 |
| 17 | 0 | 5 | 0 |
| 18 | 0 | 5 | 0 |
| 19 | 0 | 5 | 0 |
| 20 | 0 | 4 | 0 |
| 21 | 0 | 4 | 0 |
| 22 | 0 | 4 | 0 |
| 23 | 0 | 4 | 0 |
| 24 | 1 | 5 | 0 |
| 25 | 1 | 5 | 0 |
| 26 | 0 | 5 | 0 |
| 27 | 1 | 6 | 0 |
| 28 | 0 | 6 | 0 |
| 29 | 1 | 7 | 0 |
| 30 | 1 | 7 | 0 |

320

| Warning = 8   Leak Rate = 10 | | | |
|---|---|---|---|
| Sequence | Error | Count | Warning |
| 1 | 1 | 1 | 0 |
| 2 | 0 | 1 | 0 |
| 3 | 0 | 1 | 0 |
| 4 | 0 | 1 | 0 |
| 5 | 0 | 1 | 0 |
| 6 | 0 | 1 | 0 |
| 7 | 0 | 1 | 0 |
| 8 | 0 | 1 | 0 |
| 9 | 0 | 1 | 0 |
| 10 | 0 | 0 | 0 |
| 11 | 1 | 1 | 0 |
| 12 | 1 | 2 | 0 |
| 13 | 1 | 3 | 0 |
| 14 | 1 | 4 | 0 |
| 15 | 1 | 5 | 0 |
| 16 | 1 | 6 | 0 |
| 17 | 0 | 6 | 0 |
| 18 | 0 | 6 | 0 |
| 19 | 0 | 6 | 0 |
| 20 | 0 | 5 | 0 |
| 21 | 0 | 5 | 0 |
| 22 | 0 | 5 | 0 |
| 23 | 0 | 5 | 0 |
| 24 | 1 | 6 | 0 |
| 25 | 1 | 7 | 0 |
| 26 | 0 | 7 | 0 |
| 27 | 1 | 8 | 1 |
| 28 | 0 | 8 | 1 |
| 29 | 1 | 9 | 1 |
| 30 | 1 | 9 | 1 |

*FIG. 3*

SYSTEM AND METHOD TO CONTROL MEMORY FAILURE HANDLING ON DOUBLE-DATA RATE DUAL IN-LINE MEMORY MODULES

CROSS REFERENCE TO RELATED APPLICATIONS

Related subject matter is contained in co-pending U.S. patent application Ser. No. 15/903,856 entitled "System and Method to Control Memory Failure Handling on Double-Data Rate Dual In-Line Memory Modules via Suspension of the Collection of Correctable Read Errors," filed Feb. 23, 2018, the disclosure of which is hereby incorporated by reference.

FIELD OF THE DISCLOSURE

This disclosure generally relates to information handling systems, and more particularly relates to controlling memory failure handling on double-data rate dual in-line memory modules.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may include a processor, a dual in-line memory module (DIMM), and a memory controller coupled to the DIMM. The memory controller may provide interrupts to the processor each time a read transaction from the DIMM results in a correctable read error. The processor may instantiate a failure predictor to receive the interrupts, accumulate a count of the interrupts, and provide a first error indication when the count exceeds a first error threshold. In accumulating the count, the failure predictor can increment the count each time the predictor receives a particular interrupt and decrement the count in accordance with an error leak rate. The error leak rate may have a first value when the DIMM is newer than a first age threshold, and have a second value when the DIMM is older than the first age threshold.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which:

FIG. 3 illustrates exemplary workings of a leaky-bucket algorithm;

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
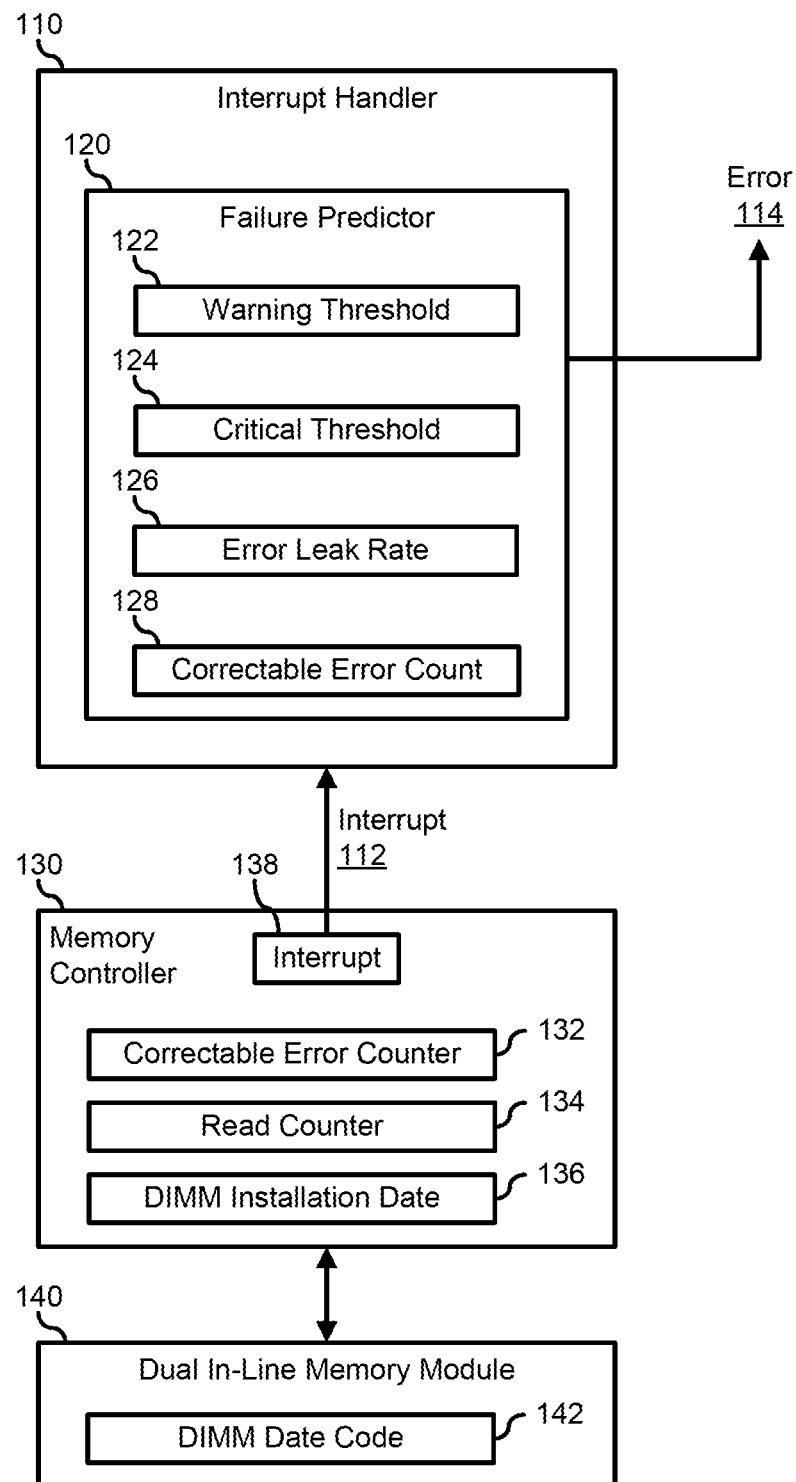
FIG. 1 is a block diagram illustrating an information handling system according to an embodiment of the present disclosure.

FIG. 1 illustrates an information handling system 100 including an interrupt handler 110, a memory controller 130, and a dual in-line memory module (DIMM) 140. Interrupt handler 110 represents a mechanism of information handling system 100 that permits the information handling system to respond to various events that occur in the information handling system. In particular, the occurrence of an event invokes a processor of the information handling system to execute an interrupt service routine to respond to the event. An event can be generated by a hardware device, a hardware exception, software instructions, or a software exception. An example of interrupt handler 110 includes a processor which implements a System Management Mode, where a hardware or software interrupt causes the processor to halt execution of code in the normal course of operation, and to instead execute an interrupt service routine associated with the particular hardware or software interrupt. In another example, interrupt handler 110 includes a processing element of information handling system 100 separate from the processor that is configurable to provide various manufacturer designed functionality to the information handling system, such as an Intel Innovation Engine, an Intel Management Engine, an AMD Secure Technology element, an AMD Platform Security Processor, or another processing element as needed or desired. The details of an interrupt handler are known in the art and will not be further described herein, except as needed to illustrate the embodiments of the present disclosure.

Memory controller 130 represents a portion of information handling system 100 that operates to manage the flow of information to the main memory of the information handling system, represented by DIMM 140. Memory controller 130 and DIMM 140 operate in accordance with a particular memory architecture implemented on information handling system 100. For example, memory controller 130 and DIMM 140 may operate in accordance with a Double-Data Rate (DDR) standard, such as a JEDEC DDR4 or DDR5 standard. It will be understood that, where memory controller 130 and DIMM 140 operate in accordance with the DDR5 standard, then the memory controller and DIMM will be configured to provide two separate memory channels.

Memory controller 130 operates to track various operational metrics in relation to the memory operations performed on DIMM 140. As such, memory controller 130 includes a correctable error counter 132, a read counter 134, a DIMM installation date register 136, and an interrupt generator 138. Memory controller 130 and DIMM 140 each operate to calculate error checking and correcting (ECC) bits associated with each memory read from the DIMM and with each memory write to the DIMM. It will be understood that, where memory controller 130 supports two or more DIMMs on a memory channel, or two or more memory channels, then the memory controller will include a separate correctable error counter similar to correctable error counter 132, a separate read counter similar to read counter 134, and a separate DIMM installation date register 136 for each DIMM supported by the memory controller.

When memory controller 130 issues a memory read to DIMM 140, the memory controller increments read counter 134. When memory controller 130 receives a data for a memory read transaction that includes error that can be corrected based upon the ECC bits, the memory controller increments correctable error counter 132 and interrupt generator 138 provides an interrupt 112 to interrupt handler 110 indicating that the memory controller has received a correctable error from DIMM 140. This interrupt can be called a correctable error interrupt. Correctable error counter 132, and read counter 134 can be read by the processor of information handling system 100, for example, in response to an interrupt service routine of interrupt handler 110, or by other mechanisms of the information handling system. The details of calculating ECC bits and the use of ECC to correct memory read and memory write errors is known in the art and will not be further discussed herein except as needed to illustrate the embodiments of the present disclosure.

During the expected lifetime of DIMM 140, correctable read errors are expected to occur periodically. In particular, system parameters, circuit margins, device aging, and other parameters can effect the signal integrity of the data being transmitted between DIMM 140 and memory controller 130, such that the data bits that were intended to be transmitted by the DIMM are mis-read by the memory controller. In general, as a DIMM ages, the number of correctable read errors is expected to increase due to circuit degradation, trace electro-migration, and other aging mechanisms in the memory cells and I/O circuits of the DIMM. Such age related correctable read errors may be correlated with an expected onset of the occurrence of uncorrectable read errors, which can lead to total system failure. As such, it is desirable to track the occurrence of correctable read errors and correlate the incidence rate of the correctable read errors to a prediction of when the DIMM is likely to fail. Then, when a DIMM is flagged as being likely to fail, a warning can be given that permits a data center service technician to proactively replace the flagged DIMM before uncorrectable errors become likely to occur on the DIMM.

Information handling system 100 operates to provide a prediction mechanism for when DIMM 140 may be likely to start exhibiting uncorrectable errors. In particular, interrupt handler 110 includes a failure predictor 120 that operates to provide progressive warnings as to the health of DIMM 140. Failure predictor 120 includes a warning threshold 122, a critical threshold 124, an error leak rate 126, and a correctable error count 128. Failure predictor 120 operates to implement a failure prediction algorithm to accumulate the number of correctable errors and to provide various warnings when the number of accumulated errors exceeds one or more of warning threshold 122 and critical threshold 124. An example of a failure prediction algorithm includes a leaky-bucket algorithm. In implementing the leaky-bucket algorithm, failure predictor 120 operates to increase the number of correctable errors accumulated in correctable error count 128, sometimes referred to as the "bucket," each time interrupt generator 138 of memory controller 130 generates a correctable error interrupt 112, and to periodically decrease the number of correctable errors accumulated in the correctable error count based upon error leak rate 126. Failure predictor 120 further operates to compare the number of collected correctable errors as found in correctable error count 128 with warning threshold 122 and with critical threshold 124. If the number of collected correctable errors exceeds warning threshold 122, then failure predictor 120 issues an error indication 114 indicating that the number of collected correctable errors exceeds the warning threshold. If further, the number of collected correctable errors continues to increase and exceeds critical threshold 124, then failure predictor 120 issues an error indication 166 indicating that the number of collected correctable errors exceeds the critical threshold. When information handling system 100 receives either error warnings 114, the information handling system can provide an indication to a data center service technician that the DIMM is likely to fail. Note that a failure predictor similar to failure predictor 110 can be implemented in interrupt handler 110 for each DIMM 140 of information handling system 100, and the parameters of the warning threshold, the critical threshold, and the error leak rate can be set individually for each DIMM based upon the type of DIMM, the age of the DIMM, the number of reads that have been experienced by the DIMM, or in accordance with other parameters of the DIMMs, as needed or desired. It will be further understood that error leak rate 126 may also include a number of errors by which to decrement correctable error counter 128 that is greater than or equal to one, as needed or desired.

Figure 2:
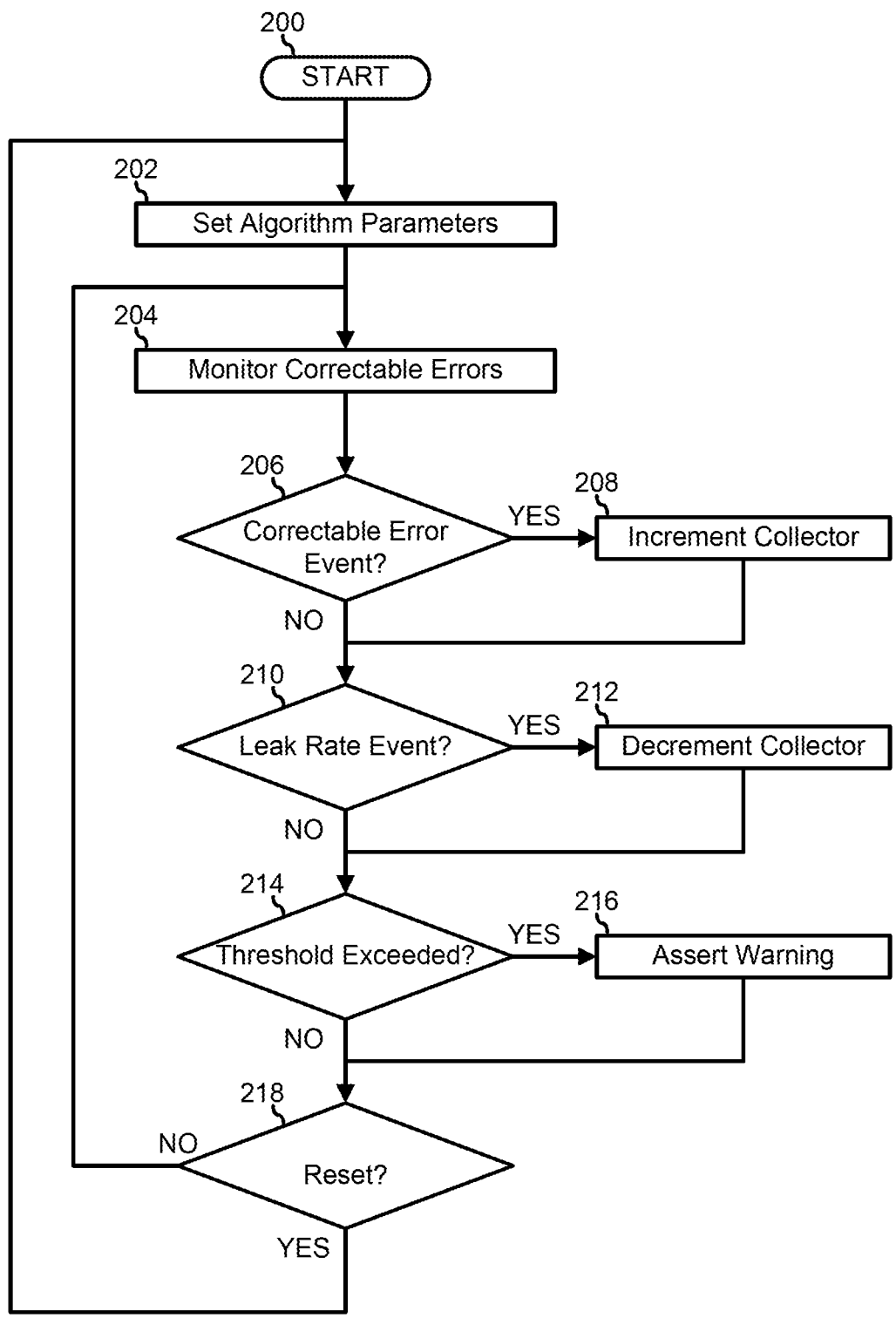
FIG. 2 is a flowchart illustrating a method for controlling memory failure handling in a DIMM of the information handling system of FIG. 1.

FIG. 2 illustrates a method for controlling memory failure handling starting at block 200. Parameters for a leaky-bucket algorithm are set in block 202. For example, during a system boot process of information handling system 100, warning threshold 122, critical threshold 124, and error leak rate 126 can be set to implement a leaky-bucket algorithm for each DIMM 140 in the information handling system. Correctable errors are monitored in block 204. For example, when memory controller 130 detects a correctable error, interrupt generator 138 can issue an interrupt to failure predictor 120. A decision is made as to whether or not a correctable error event has been detected in decision block 206. If so, the "YES" branch of decision block 206 is taken, a correctable error count is incremented in block 208, and the method proceeds to decision block 210. For example, if a correctable error interrupt is received by failure predictor 120, a system BIOS can read correctable error counter 132 and store the value to correctable error count 128, and the failure predictor can the increment correctable error count. If a correctable error event has not been detected, the "NO" branch of decision block 206 is taken and a decision is made as to whether or not a leak rate event has occurred in decision block 210.

If so, the "YES" branch of decision block 210 is taken, a correctable error count is decremented in block 212, and the method proceeds to decision block 214. For example, if a number of leak events that is equal to error leak rate 126 have transpired, then failure predictor 120 can decrement correctable error count 128. If a leak rate event has not occurred, the "NO" branch of decision block 210 is taken and a decision is made as to whether or not an error threshold has been exceeded in decision block 214. If so, the "YES" branch of decision block 214 is taken, a warning is asserted in block 216, and the method proceeds to decision block 218. For example, correctable error count 128 can exceed one of warning threshold 122 or critical threshold 124 and failure predictor 120 can issue error indication 114. If the error threshold has not been exceeded, the "NO" branch of decision block 214 is taken and a decision is made as to whether or not a system reset has occurred in decision block 218. If not, the "NO" branch of decision block 218 is taken and the method proceeds to block 204 where correctable errors are monitored. If a system reset has occurred, the "YES" branch of decision block 218 is taken and the method proceeds to block 202 where parameters for the leaky-bucket algorithm are set.

FIG. 3 illustrates an embodiment of the workings of the leaky-bucket algorithm as provided by failure predictor 120, or by the method of FIG. 2. A sequence of 30 events is shown with a particular error pattern associated with the sequence, the error count collected during each event of the sequence, and an indication for each sequence as to whether or not an error warning is issued. An example of the sequence of events upon which the leak rate is based can include an elapsed time, a number of transactions on the memory interface, a number of read transactions on the memory interface, or another event as needed or desired. In a first case 310, a warning threshold is set at eight (8) errors, and the leak rate is set to decrement the counter every five (5) events. It will be noted that in this case, at no event does the error count equal eight (8) errors, and so no error warning is issued, because the error leak rate of five (5) events provides a high frequency of decrementing events. In a second case 320, a warning threshold is set at eight (8) errors, and the leak rate is set to decrement the counter every 10 events. It will be noted that in this case, with the same error pattern as the first case, the error count eventually equals and exceeds the eight (8) error threshold, and the error warning is issued, because the error leak rate of 10 events provides a lower frequency of decrementing events.

As noted above, as a DIMM ages, the expected rate of received correctable read errors is expected to increase. As such, for a newer DIMM, the first case 310 may provide for optimal performance without unduly signaling that number of correctable read errors is too high, while the second case 320 may result in an excessive number of errors, and so setting a faster leak rate (i.e., a lower number) for a newer DIMM may be more desirable. On the other hand, for an older DIMM, the second case 320 may provide for optimal performance by more frequently signaling that the number of correctable read errors is too high, while the first case 310 may mask an increase in correctable read errors that would otherwise give a more advanced warning of impending failure of the DIMM, and so setting a slower leak rate (i.e., a higher number) for an older DIMM may be more desirable.

Returning to FIG. 1, in a particular embodiment, the settings for warning threshold 122, critical threshold 124, and error leak rate 126 are dynamically maintained for DIMM 140 based upon the age of the DIMM. Here, as DIMM 140 ages, the settings for warning threshold 122, critical threshold 124, and error leak rate 126 are periodically changed based upon the age of the DIMM, such that the settings provide for optimal performance without unduly signaling that number of correctable read errors is too high when the DIMM is newer, and such that the settings provide for optimal performance by more frequently signaling that the number of correctable read errors is too high without masking an increase in correctable read errors that would otherwise give a more advanced warning of impending failure of the DIMM when the DIMM is older. Note that similar performance optimization may be obtained by changing the warning thresholds or by changing the number of correctable errors that are decremented from the correctable error count when the leak event occurs. For example, decreasing an error threshold or decreasing a number of errors decremented may provide a more optimized detection of the onset of uncorrectable errors in an older DIMM.

DIMM 140 includes a DIMM date code 142 which is provided by the DIMM manufacturer and which identifies a date that the DIMM was manufactured, along with other information to identify the place and time of manufacturing, and other information. In a particular embodiment, information handling system 100 determines the age of DIMM 140 based upon the information provided by DIMM date code 142. Here, information handling system 100 reads the information from DIMM date code 142, determines the age of DIMM 140 based upon the information, and sets warning threshold 122, critical threshold 124, and error leak rate 126 based upon the age of the DIMM. In another embodiment, information handling system 100 determines the age of DIMM 140 based upon the information provided by DIMM installation date register 136. Here, information handling system 100 reads the information from DIMM installation date register 136, determines the age of DIMM 140 based upon the information, and sets warning threshold 122, critical threshold 124, and error leak rate 126 based upon the age of the DIMM. In either case, for example, information handling system 100 can set warning threshold 122, critical threshold 124, and error leak rate 126, such that when DIMM 140 is newer than an age threshold, the warning threshold, the critical threshold, and the error leak rate have first values, and when the DIMM is older than the age threshold, the warning threshold, the critical threshold, and the error leak rate have second, more stringent values. It will be understood that information handling system 100 may implement two or more age thresholds, and may thus implement three or more sets of settings for warning threshold 122, critical threshold 124, and error leak rate 126, as needed or desired.

In a particular embodiment, when information handling system 100 performs a system boot process, the system BIOS operates to read the age of DIMM 140, and sets warning threshold 122, critical threshold 124, and error leak rate 126 based upon the age of the DIMM. For example, the system BIOS can read SPD data from DIMM 140 to determine the information from DIMM date code 142, and the identify other information related to the type, density, vendor, technology, or other information, and set warning threshold 122, critical threshold 124, and error leak rate 126 based upon the SPD data. In another example, the system BIOS can read the information from DIMM installation date register 128, and set warning threshold 122, critical threshold 124, and error leak rate 126 based upon the DIMM installation date information. In a particular case, the SPD data can include manufacturer suggested settings and age thresholds. In another case, the system BIOS can be configured to download suggested settings and age thresholds from a third-party server. In another case, the system BIOS is programmed with the settings and age thresholds. In yet another case, the system BIOS can obtain the suggested settings and age thresholds by one of the above methods, and can be configured to modify the suggested settings and age thresholds, as needed or desired. In another case, the system BIOS can be configured to update the settings and age thresholds on a periodic basis, such as at a particular time each day, at a particular time each week, after a particular duration of time has elapsed, or after another periodic interval, as needed or desired.

In another embodiment, failure predictor 120 operates to read the age of DIMM 140, and sets warning threshold 122, critical threshold 124, and error leak rate 126 based upon the age of the DIMM. For example, the failure predictor 120 can read the information from DIMM date code 142, and set warning threshold 122, critical threshold 124, and error leak rate 126 based upon the DIMM date code information. In another example, the failure predictor 140 can read the information from DIMM installation date register 128, and set warning threshold 122, critical threshold 124, and error leak rate 126 based upon the DIMM installation date information. In a particular case, failure predictor 120 can read manufacturer suggested settings and age thresholds from DIMM 140. In another case, failure predictor 120 can be configured to download suggested settings and age thresholds from a third-party server. In another case, failure predictor 120 is programmed with the settings and age thresholds. In yet another case, failure predictor 120 can obtain the suggested settings and age thresholds by one of the above methods, and can be configured to modify the suggested settings and age thresholds, as needed or desired. In another case, failure predictor 120 can be configured to update the settings and age thresholds on a periodic basis, such as at a particular time each day, at a particular time each week, after a particular duration of time has elapsed, or after another periodic interval, as needed or desired. In any of the above embodiments or cases, failure predictor 120 can be prompted to set the settings in response to a correctable error interrupt.

Memory controller 130 includes read counter 134 which provides a count of the number of times that read operations have been performed on DIMM 140. In a particular embodiment, information handling system 100 determines the age of DIMM 140 based upon the information provided by read counter 134. Here, failure predictor 120 retrieves the information from read counter 134, determines the age of DIMM 140 based upon the information, and sets warning threshold 122, critical threshold 124, and error leak rate 126 based upon the age of the DIMM in read operations. For example, information handling system 100 can set warning threshold 122, critical threshold 124, and error leak rate 126, such that when DIMM 140 has experienced fewer reads than a read age threshold, the warning threshold, the critical threshold, and the error leak rate have first values, and when the DIMM has experienced more reads than the read age threshold, the warning threshold, the critical threshold, and the error leak rate have second, more stringent values. It will be understood that information handling system 100 may implement two or more read age thresholds, and may thus implement three or more sets of settings for warning threshold 122, critical threshold 124, and error leak rate 126, as needed or desired.

In a particular embodiment, when information handling system 100 performs a system boot process, the system BIOS operates to retrieve read counter 134, and sets warning threshold 122, critical threshold 124, and error leak rate 126 based upon the age of the DIMM in read operations. In another case, the system BIOS can be configured to download suggested settings and read age thresholds from a third-party server. In another case, the system BIOS is programmed with the settings and read age thresholds. In yet another case, the system BIOS can obtain the suggested settings and read age thresholds by one of the above methods, and can be configured to modify the suggested settings and read age thresholds, as needed or desired. In another case, the system BIOS can be configured to update the settings and read age thresholds on a periodic basis, such as after a particular number of read operations, as needed or desired.

In another embodiment, failure predictor 120 operates to retrieve read counter 134, and sets warning threshold 122, critical threshold 124, and error leak rate 126 based upon the age of the DIMM in read operations. In another case, failure predictor 120 can be configured to download suggested settings and read age thresholds from a third-party server. In another case, failure predictor 120 is programmed with the settings and read age thresholds. In yet another case, the system BIOS can obtain the suggested settings and read age thresholds by one of the above methods, and can be configured to modify the suggested settings and read age thresholds, as needed or desired. In another case, failure predictor 120 can be configured to update the settings and read age thresholds on a periodic basis, such as after a particular number of read operations, as needed or desired. In any of the above embodiments or cases, failure predictor 120 can be prompted to set the settings in response to a correctable error interrupt.

Figure 4:
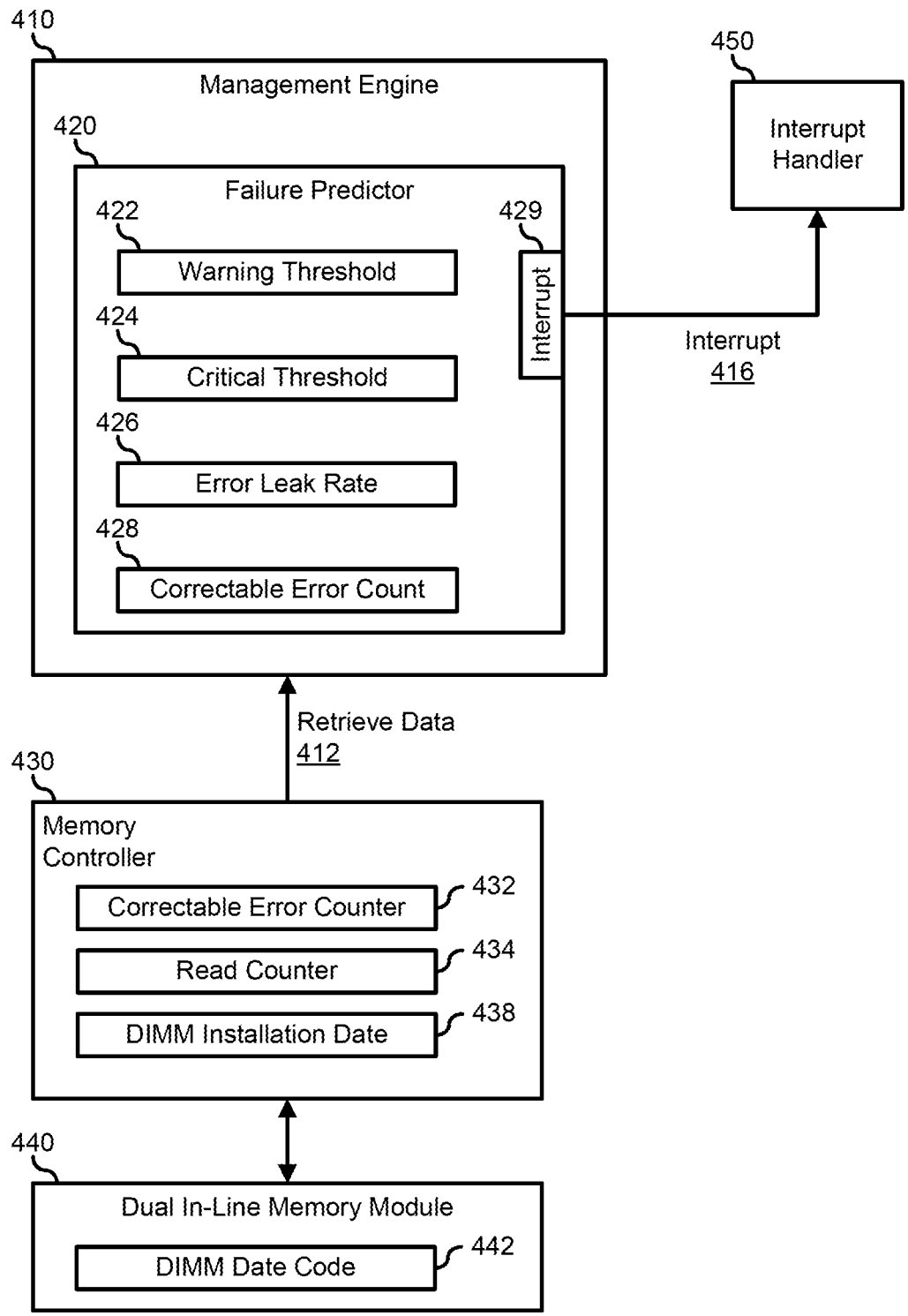
FIG. 4 is a block diagram illustrating an information handling system according to another embodiment of the present disclosure.

FIG. 4 illustrates an information handling system 400 similar to information handling system 100, and including a management engine 410, a memory controller 430, a dual in-line memory module (DIMM) 440, and an interrupt handler 450. Management engine 410 represents a processing element of information handling system 400 separate from the processor and from a service processor, that is configurable to provide various manufacturer designed functionality to the information handling system, such as an Intel Innovation Engine, an Intel Management Engine, an AMD Secure Technology element, an AMD Platform Security Processor, or another processing element as needed or desired. Memory controller 430 is similar to memory controller 130, operating to track the various operational metrics in relation to the memory operations performed on DIMM 440. As such, memory controller 430 includes a correctable error counter 432 similar to correctable error counter 132, a read counter 434 similar to read counter 134, and a DIMM installation date register 436 similar to DIMM installation data register 136. DIMM 440 is similar to DIMM 140, and includes a DIMM date code 442 similar to DIMM date code 142. Interrupt handler 450 is similar to interrupt handler 110. When memory controller 430 issues a memory read to DIMM 440, the memory controller increments read counter 434.

Information handling system 400 operates to provide a prediction mechanism for when DIMM 440 may be likely to start exhibiting uncorrectable errors. In particular, management engine 410 includes a failure predictor 420 similar to failure predictor 120, that operates to provide progressive warnings as to the health of DIMM 440. Failure predictor 420 includes a warning threshold 422 similar to warning threshold 122, a critical threshold 424 similar to critical threshold 124, an error leak rate 426 similar to error leak rate 126, a correctable error count 428 similar to correctable error count 128, and an interrupt generator 429. Failure predictor 420 operates to retrieve the correctable error count information from correctable error counter 432 and read counter information from read counter 236, to implement a failure prediction algorithm to accumulate the number of correctable errors and to provide various warnings when the number of accumulated errors exceeds one or more of warning threshold 422 and critical threshold 424. An example of a failure prediction algorithm includes a leaky-bucket algorithm as described above. If the number of collected correctable errors exceeds warning threshold 422, then interrupt generator 429 issues a warning interrupt 416 to interrupt handler 450 indicating that the number of collected correctable errors exceeds the warning threshold. If further, the number of collected correctable errors continues to increase and exceeds critical threshold 124, then interrupt generator 429 issues a critical interrupt 414 to interrupt handler 450 indicating that the number of collected correctable errors exceeds the critical threshold. When interrupt handler 450 receives either error warnings 414, information handling system 400 can provide an indication to a data center service technician that the DIMM is likely to fail. Note that a failure predictor similar to failure predictor 420 can be implemented in management engine 410 for each DIMM 440 of information handling system 400, and the parameters of the warning threshold, the critical threshold, and the error leak rate can be set individually for each DIMM based upon the type of DIMM, the age of the DIMM, the number of reads that have been experienced by the DIMM, or in accordance with other parameters of the DIMMs, as needed or desired. It will be further understood that error leak rate 426 may also include a number of errors by which to decrement correctable error counter 428 that is greater than or equal to one, as needed or desired.

Failure predictor 420, by retrieving the correctable error count information from correctable error counter 432, generates the correctable error count information based upon prior retrievals of the correctable error count information, and subtracting the prior correctable error count information from the current correctable error count information. However, because correctable error counter 432 is typically implemented as a register of a fixed bit-length, a situation may arise where, between retrievals of the correctable error count information from the correctable error counter, the correctable error counter may have overflowed and continued the count of correctable errors at zero. As such, failure predictor 420 needs to account for the possibility that the current correctable error count information is less than the prior correctable error count information. In a first embodiment, this situation is handled by providing an overflow indication in memory controller 430 that is set when correctable error counter 432 overflows. Then, when failure predictor 420 retrieves the correctable error count information, memory controller 430 also provides the overflow indication. Then, failure predictor 420 operates to take an overflow into account when determining the correctable error count for correctable error counter 432. In another embodiment, failure predictor 420 is configured to poll memory controller 430 at a rate that guarantees that multiple overflow events can not happen in correctable error counter 434. For example, if correctable error counter 432 is a four-bit counter, then failure predictor 420 can be configured to retrieve the information from correctable error counter 432 in an amount of time that it takes to process at most 16 ($2^4$) memory read operations.

Figure 5:
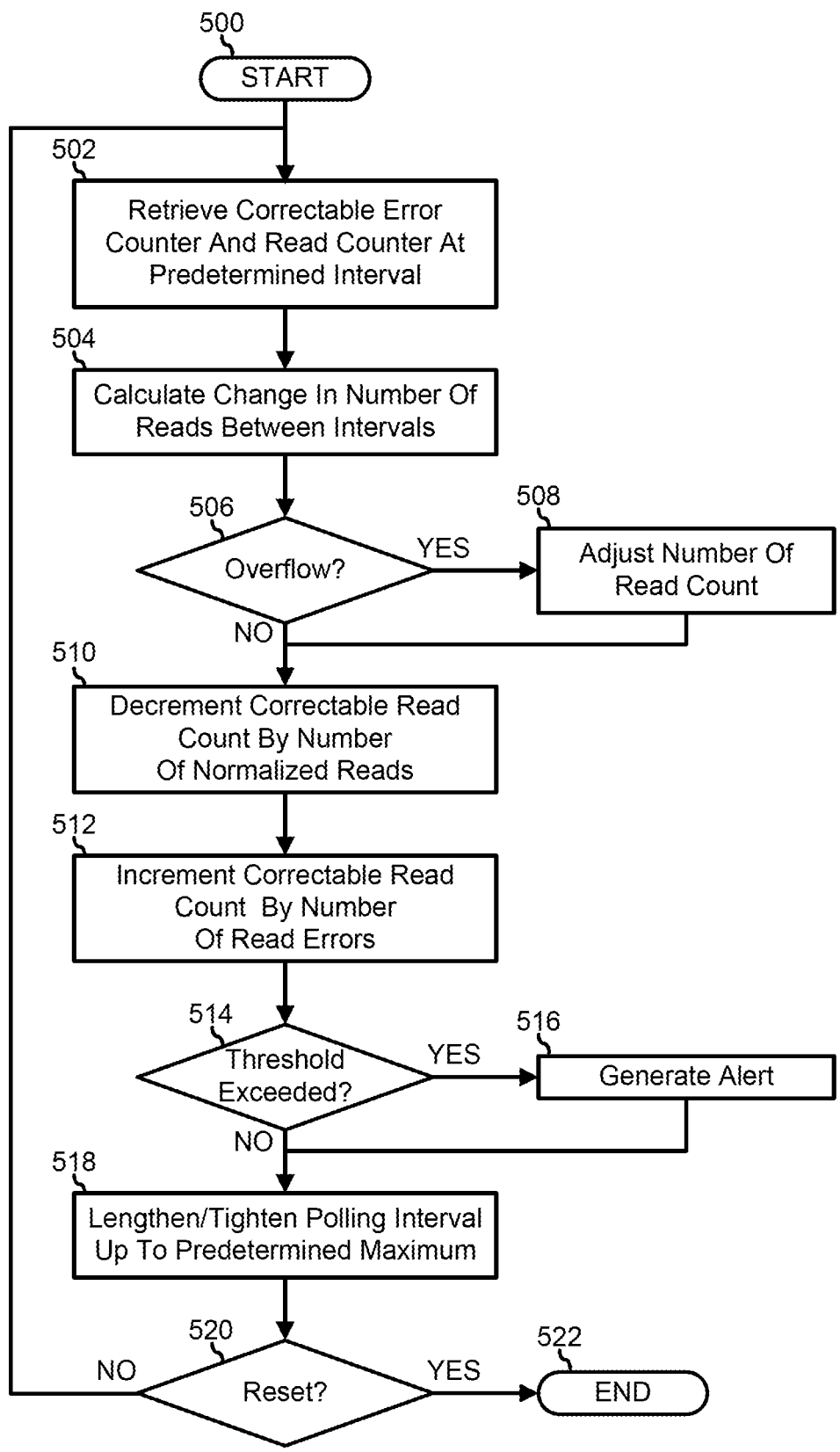
FIG. 5 is a flowchart illustrating a method for controlling memory failure handling in a DIMM of the information handling system of FIG. 4.

In another embodiment, failure predictor 420 provides a method for controlling memory failure handling as illustrated in the method of FIG. 5, starting at block 500. Values from a correctable read error counter and a read counter are retrieved at a predetermined interval from a memory controller in block 502. For example, management engine 410 can periodically retrieve the value from correctable read counter 432 and from read counter 434. A change in the number of reads since a previous pre-determined interval can be calculated in block 504, and a decision is made as to whether or not the value from the read counter has overflowed in decision block 506. If so, the "YES" branch of decision block 506 is taken, the read count value is adjusted to account for the overflow in block 508, and the method proceeds to block 510, described below.

If the value from the read counter has not overflowed, the "NO" branch of decision block 506 is taken and the method proceeds to block 510. When the "NO" branch of decision block 506 is taken or after the read count value is adjusted in block 508, a correctable read error count is decremented by a normalized number of reads in block 510. For example, management engine 410 can implement a leak rate of one (1) correctable read error every 100 thousand reads. Here, management engine 410 can divide the actual number of reads performed during the pre-determined interval by 100 thousand, and subtract that number from correctable error count register 428 to implement the leak rate action. The correctable read error count is incremented by the number of correctable read errors retrieved from the correctable read error counter in block 512. For example, management engine 410 can add the number of correctable read errors retrieved from correctable read error counter 432 to the value of correctable read error count 428 to implement the error collection. A decision is made as to whether or not the correctable read error count exceeds a warning threshold or a critical threshold in decision block 514. If so, the "YES" branch of decision block 514 is taken, an alert is generated in block 516, and the method proceeds to block 518 as described below.

If the correctable read error count does not exceed the warning threshold or the critical threshold in decision block 514, the "NO" branch of decision block 514 is taken and the method proceeds to block 518. When the "NO" branch of decision block 514 is taken, or after the alert is generated in block 516, the predetermined interval is lengthened or tightened in block 518. Whether the predetermined interval is lengthened or tightened depends on whether or not the read error count exceeds the warning threshold. If the read error count did not exceed the threshold, then the predetermined time interval can be lengthened, while if the read error count exceeded the threshold, then the predetermined time interval can be tightened. A decision is made as to whether or not the system has been reset in block 520. If not, the "NO" branch of decision block 520 is taken and the method returns to block 502 the values from the correctable read error counter and the read counter are retrieved at the next predetermined interval from the memory controller. If so, the "YES" branch of decision block 520 is taken and the method ends in block 522.

In another embodiment, management engine 410 receives an interrupt each time memory controller 430 receives a correctable error. Here, failure predictor 420 operates similarly to failure predictor 120 as described above, but only generates interrupt 416 when one of warning threshold 422 or critical threshold 424 is exceeded. In this way, interrupt handler 450 receives fewer interrupts than does interrupt handler 110, and the load from processing correctable error interrupts on the processor of information handling system 400 is less than for the processor of information handling system 100, because the processing of correctable error interrupts from memory controller 430 are filtered by failure predictor 420, and only the correctable errors that exceed a threshold are processed by the processor of information handling system 400.

Figure 6:
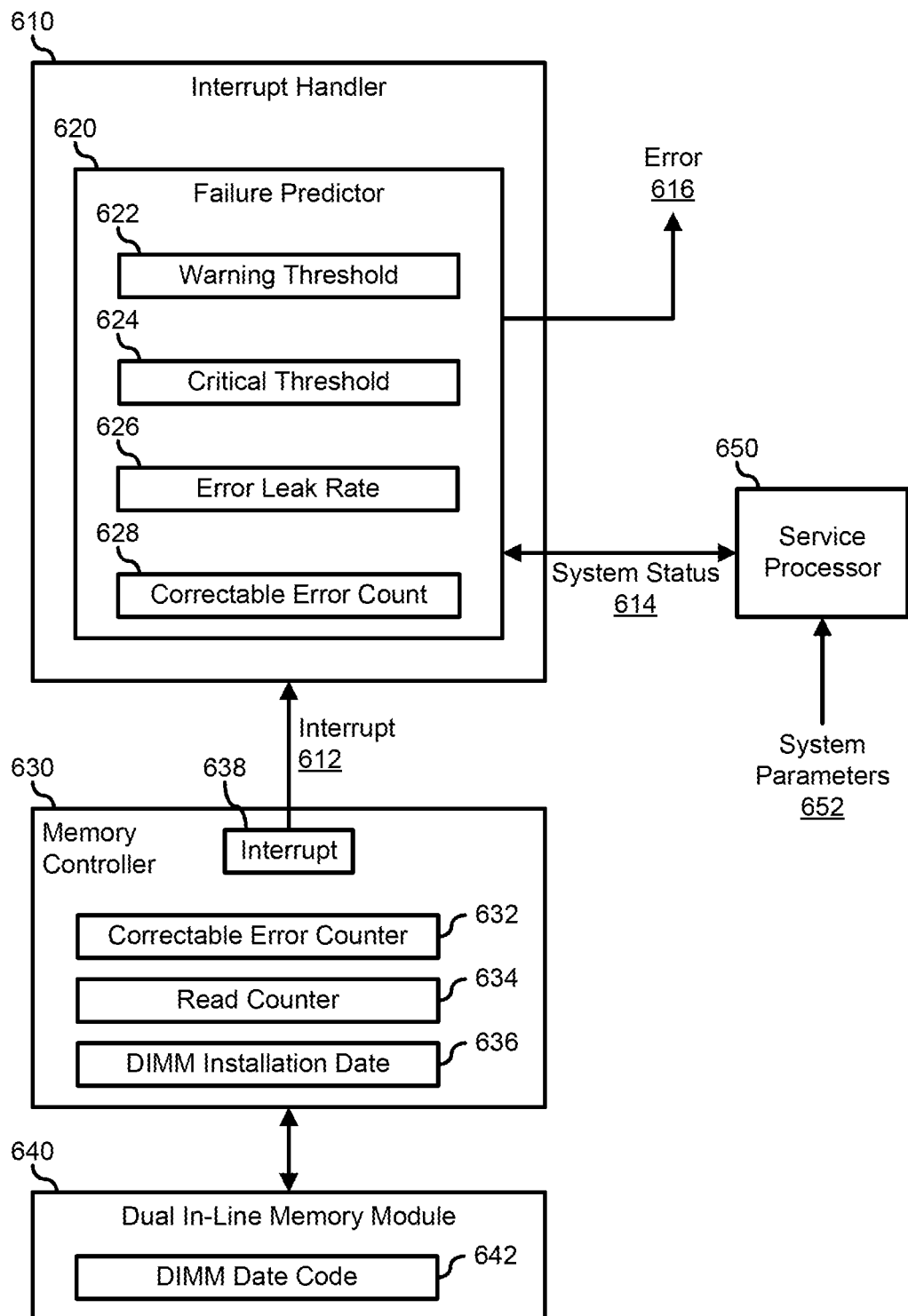
FIG. 6 is a block diagram illustrating an information handling system according to another embodiment of the present disclosure.

FIG. 6 illustrates an information handling system 600 similar to information handling system 100, and including a interrupt controller 610, a memory controller 630, a dual in-line memory module (DIMM) 640, and a service processor 650. Interrupt controller 610 is similar to interrupt controller 110, and incldues a failure predictor 620 similar to failure predictor 120. Memory controller 630 is similar to memory controller 130, operating to track the various operational metrics in relation to the memory operations performed on DIMM 640. As such, memory controller 630 includes a correctable error counter 632 similar to correctable error counter 132, a read counter 634 similar to read counter 134, a DIMM installation date register 636 similar to DIMM installation data register 136, and an interrupt generator 638 similar to interrupt generator 138. DIMM 640 is similar to DIMM 140, and includes a DIMM date code 642 similar to DIMM date code 142. When memory controller 630 issues a memory read to DIMM 640, the memory controller increments read counter 434. Then, memory controller 630 receives a data for a memory read transaction that includes error that can be corrected based upon the ECC bits, the memory controller increments correctable error counter 632 and interrupt generator 638 provides an interrupt 612 to interrupt handler 610 indicating that the memory controller has received a correctable error from DIMM 640. This interrupt can be called a correctable error interrupt. Correctable error counter 632, and read counter 634 can be read by the processor of information handling system 600, for example, in response to an interrupt service routine of interrupt handler 610, by service processor 650, or by other mechanisms of the information handling system.

Service processor 650 represents a service processor separate from the processor of information handlings system 600 that provides the data processing functionality of the information handling system, that operates to monitor, manage, and control various system level features of the information handling system, such as processor and system voltage levels, system temperatures, system fan speeds, firmware upgrades, and other operations. In a particular embodiment, service processor 650 operates in accordance with an Intelligent Platform Management Interface (IPMI) specification.

Information handling system 600 operates to provide a prediction mechanism for when DIMM 640 may be likely to start exhibiting uncorrectable errors. In particular, interrupt handler 610 includes a failure predictor 620 similar to failure predictor 120, that operates to provide progressive warnings as to the health of DIMM 640. Failure predictor 620 includes a warning threshold 622 similar to warning threshold 122, a critical threshold 624 similar to critical threshold 124, an error leak rate 626 similar to error leak rate 126, and a correctable error count 628 similar to correctable error count 128.

Failure predictor 620 operates to implement a failure prediction algorithm to accumulate the number of correctable errors and to provide various warnings when the number of accumulated errors exceeds one or more of warning threshold 622 and critical threshold 624. An example of a failure prediction algorithm includes a leaky-bucket algorithm. In implementing the leaky-bucket algorithm, failure predictor 620 operates to increase the number of correctable errors accumulated in correctable error count 628, sometimes referred to as the "bucket," each time interrupt generator 638 of memory controller 630 generates a correctable error interrupt 612, and to periodically decrease the number of correctable errors accumulated in the correctable error count based upon error leak rate 626. Failure predictor 620 further operates to compare the number of collected correctable errors as found in correctable error count 628 with warning threshold 622 and with critical threshold 624. If the number of collected correctable errors exceeds warning threshold 622, then failure predictor 620 issues an error indication 614 indicating that the number of collected correctable errors exceeds the warning threshold. If further, the number of collected correctable errors continues to increase and exceeds critical threshold 624, then failure predictor 620 issues an error indication 616 indicating that the number of collected correctable errors exceeds the critical threshold. When information handling system 600 receives either error warnings 614, the information handling system can provide an indication to a data center service technician that the DIMM is likely to fail. Note that a failure predictor similar to failure predictor 610 can be implemented in interrupt handler 610 for each DIMM 640 of information handling system 600, and the parameters of the warning threshold, the critical threshold, and the error leak rate can be set individually for each DIMM based upon the type of DIMM, the age of the DIMM, the number of reads that have been experienced by the DIMM, or in accordance with other parameters of the DIMMs, as needed or desired. It will be further understood that error leak rate 626 may also include a number of errors by which to decrement correctable error counter 628 that is greater than or equal to one, as needed or desired.

As the speed of DDR memory increases and the geometries of the DRAM devices that compose the DIMMs decreases, the likelihood of experiencing correctable read errors increases, due in part to the challenge of maintaining acceptable service life out of the DIMMs, but also due to the increased likelihood that other conditions on the information handling system are injecting errors into the data transmissions between the memory controller and the DIMM. For example, noise on voltage regulators that supply power to the memory controller, to the DIMM, to the processor, or to other devices can be inadequately isolated form the transmitter and receiver circuits of the memory controller or the DIMM and can thus introduce unwanted transients onto the data signals between the memory controller and the DIMM. In another example, signal carrying circuits associated with other interfaces, including other nearby memory channels can introduce unwanted transients onto the data signals by various crosstalk mechanisms. In another example, various environmental conditions, such as the temperature of the memory controller, the DIMM, or other elements of the information handling system, may adversely affect the transmission signals. Other conditions may be harder to characterize, but may be detectable by the presence of errors on other interfaces of the information handling system that inject errors across multiple systems of the information handling system.

It has been found that the existence of correctable read errors due to such circumstances as described above may be exhibited at random times, but for finite durations. That is, a condition that adversely affects the number of correctable read errors between the memory controller and the DIMM may not persist for a long time. For example, where uncorrectable read errors are caused by noise on the voltage regulators, it may be determined that such noise occurs at random times, but that the noise only persists for a short duration of time. However, where an information handling system implements a leaky-bucket algorithm for predicting error on a DIMM, the collection of correctable read errors due to circumstances of the information handling system that are unrelated to DIMM health may lead to an unnecessary increase in the number of warning error indications and critical error indications that are provided by the failure predictor.

In order to prevent failure predictor 620 from unnecessarily providing warning error indications and critical error indications 616 due to circumstances of the information handling system that are unrelated to DIMM health, the failure predictor operates to temporarily suspend the collection of correctable read errors for duration of time when the number of errors exceed warning threshold 622. In this way, failure predictor 620 implements a mechanism that assumes that a first occurrence of excessive correctable read errors is more likely to be the result of conditions on the information handling system that are unrelated to DIMM health. If, after the collection of correctable read errors is suspended, the leaky-bucket algorithm no longer indicates the warning error, then the assumption can be deemed to be validated, and operations continue as if warning threshold 622 had not been exceeded (i.e., no warning 616 error is indicated). On the other hand, if the correctable read errors are in fact related to DIMM health, then, after the collection of correctable read errors is suspended, the leaky-bucket algorithm will continue to indicate the warning error, and may proceed to indicate the critical error.

Failure predictor 620 operates to receive system status information from service processor 650. Here, service processor 650 is configured to receive various system parameters 652 from information handling system 600. System parameters 652 can include indications of the existence of noise on the voltage regulators that supply power to memory controller 630, to DIMM 640, to the processor of information handling system 600, and to other components of the information handling system. System parameters 652 can also include temperature information for the components of information handling system 600, including for memory controller 630 and for EIMM 640. System parameters 652 can also include information that indicates that other subsystems of information handling system 600 are experiencing errors. When the number or correctable read errors exceeds warning threshold 622, failure predictor 620 retrieves system status information 614 from service processor 650 to determine if there are any conditions on information handling system 600 that are likely to correlate to an increase in the number of correctable read errors, and to modify the duration of the suspension of correctable read errors based upon the system status information. For example, it may be known that noise on a voltage regulator normally persists for a short duration of time, and so failure predictor 620 can suspend the collection of correctable read errors for a duration equal to or slightly longer than the expected noise duration. In another example, failure predictor 620 may suspend the collection of correctable read errors for as long as the DIMM temperature is above a certain level, and then, when the system status information indicates that the DIMM temperature has dropped below the level, then the failure predictor can resume the collection of correctable read errors.

Figure 7:
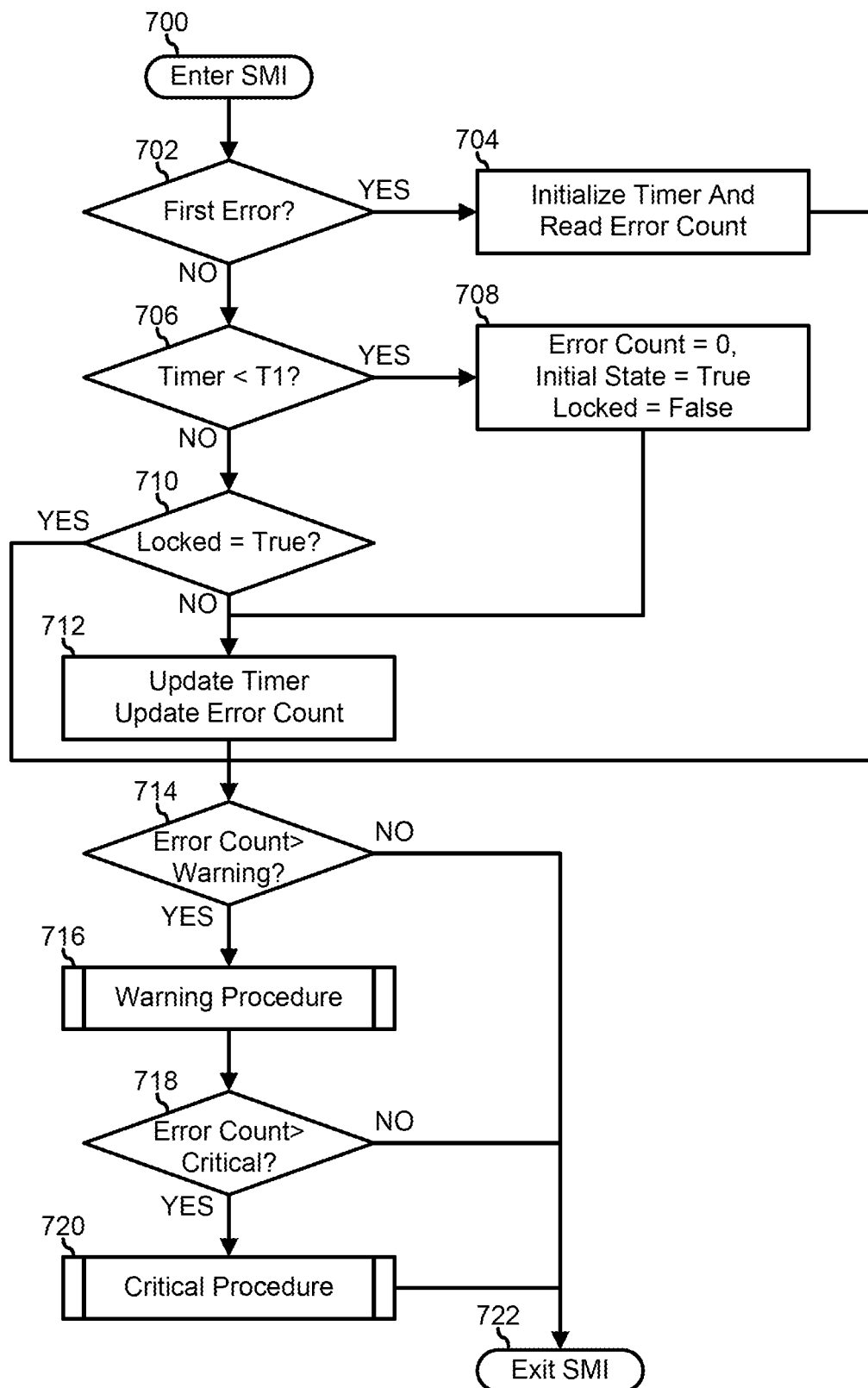
FIGS. 7-9 provide a flowchart illustrating a method for controlling memory failure handling in a DIMM of the information handling system of FIG. 6.
Figure 8:
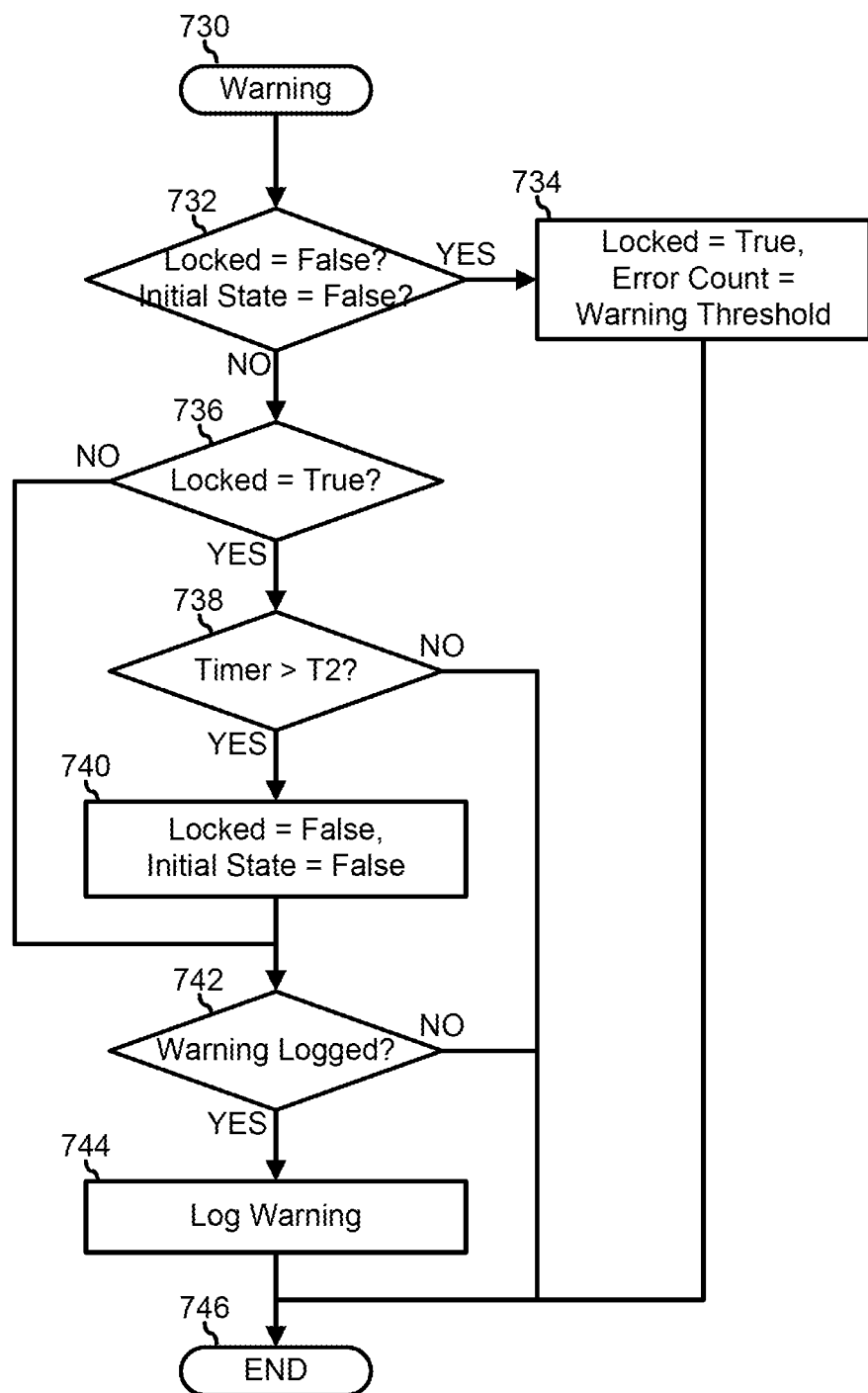
Figure 9:
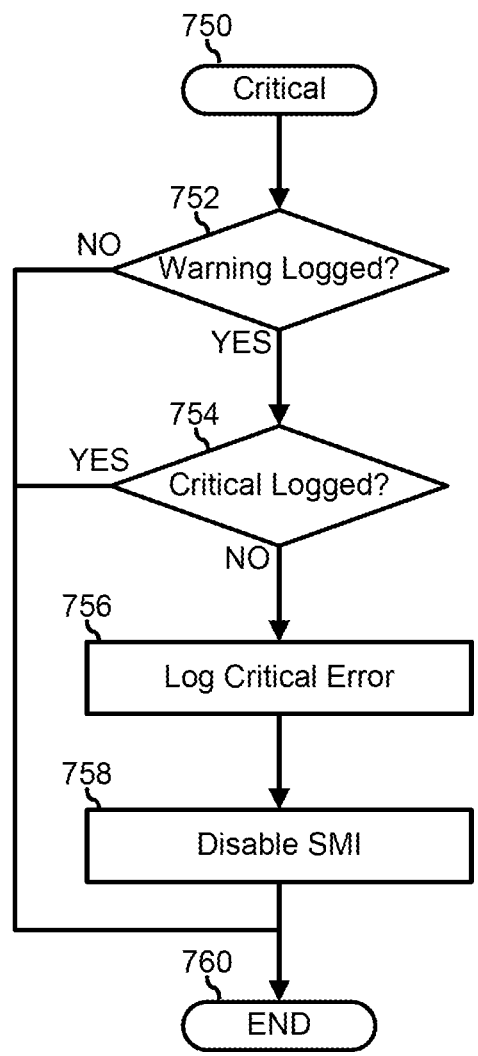

FIGS. 7-9 illustrate a method for controlling memory failure handling starting at block 700, where a correctable error interrupt has been received and an interrupt handler has invoked a failure predictor to implement the leaky-bucket algorithm. A decision is made as to whether or not the correctable error was a first correctable error in decision block 702. When the correctable error was the first correctable error, the "YES" branch of decision block 702 is taken and a timer, a read error count are initialized in block 704, and the method proceeds to decision block 714 where a decision is made as to whether or not the read error count is greater than a warning threshold. Since the correctable error was the first correctable error, the "NO" branch of decision block 712 is taken and the interrupt handler exits the method in block 722.

When the correctable error was not the first correctable error, the "NO" branch of decision block 706 is taken and a decision is made as to whether or not the timer value is less than a leak rate (T1) in decision block 706. If so the "YES" branch of decision block 706 is taken, the read error count is set to zero (0), an initial state is set to "TRUE", and a locked state is set to "FALSE" in block 708, and the method proceeds to block 712 as described below. If the timer value is not less than the leak rate, the "NO" branch of decision block 706 is taken and a decision is made as to whether or not the locked state is "TRUE" in decision block 710. If not, that is, if the locked state is "FALSE", the "NO" branch of decision block 710 is taken. When the "NO" branch of decision block 710 is taken, or when the read error count, the initial state, and the locked state are set in block 708, the timer is updated and the read error count is incremented in block 712. If the locked state is "TRUE", the "YES" branch of decision block 710 is taken.

When the "YES" branch of decision block 710 is taken, when the timer and the read error count are modified in block 712, or when the timer and the read error count are initialized in block 704, a decision is made as to whether or not the read error count value is greater than a warning threshold in decision block 714. If not, the "NO" branch of decision block 714 is taken and the interrupt handler exits the method in block 722. If the read error count value is greater than the warning threshold, the "YES" branch of decision block 714 is taken and a warning procedure 716 is performed, as shown in FIG. 8 and described below, and a decision is made as to whether or not the read error count value is greater than a critical threshold in decision block 718. If not, the "NO" branch of decision block 718 is taken and the interrupt handler exits the method in block 722. If the read error count value is greater than the critical threshold, the "YES" branch of decision block 718 is taken, a critical procedure 720 is performed, as shown in FIG. 9 and described below, and the interrupt handler exits the method in block 722.

FIG. 8 illustrates warning procedure 716 starting at block 730. A decision is made as to whether or not the locked state is "FALSE" and the initial state is "FALSE" in decision block 732. If both the locked state is "FALSE" and the initial state is "FALSE," the "YES" branch of decision block 732 is taken, the locked state is set to "TRUE" and the read error count is set to the warning threshold in block 734, and warning procedure 717 ends in block 746. If either the locked state is not "FALSE" or the initial state is not "FALSE," i.e., if either the of locked state or the initial state are "TRUE," the "NO" branch of decision block 732 is taken, and a decision is made as to whether or not the locked state is "TRUE" in decision block 736. If not, the "NO" branch of decision block 736 is taken and the method proceeds to decision block 742, as described below. If the locked state is "TRUE," the "YES" branch of decision block 736 is taken and a decision is made as to whether or not the timer value is greater than a suspend duration (T2) in decision block 738. If not, the "NO" branch of decision block 738 is taken and warning procedure 716 ends in block 746. If the timer value is greater than the suspend duration (T2), the "YES" branch of decision block 738 is taken, the locked state is set to "FALSE" and the initial state is set to "FALSE" in block 740, and the method proceeds to decision block 740. When either the "NO" branch of decision block 736 is taken, or the locked and initial states are set to "FALSE" in block 740, a decision is made as to whether or not the warning event has been logged in decision block 742. If not, the "NO" branch of decision block 742 is taken and warning procedure 716 ends in block 746. If the warning event as not been logged, the "NO" branch of decision block 742 is taken, the warning is logged in block 744, and warning procedure 716 ends in block 746.

FIG. 9 illustrates critical procedure 720 starting at block 750. A decision is made as to whether or not the warning event has been logged in decision block 752. If not, the "NO" branch of decision block 752 is taken and critical procedure 720 ends in block 760. If the warning event has been logged, the "YES" branch of decision block 752 is taken and a decision is made as to whether or not the critical event has been logged in decision block 754. If so, the "YES" branch of decision block 754 is taken and critical procedure 720 ends in block 760. If the critical event has not been logged, the "NO" branch of decision block 754 is taken, the critical event is logged in block 756, further interrupts are disabled in block 758, and critical procedure 720 ends in block 760.

Figure 10:
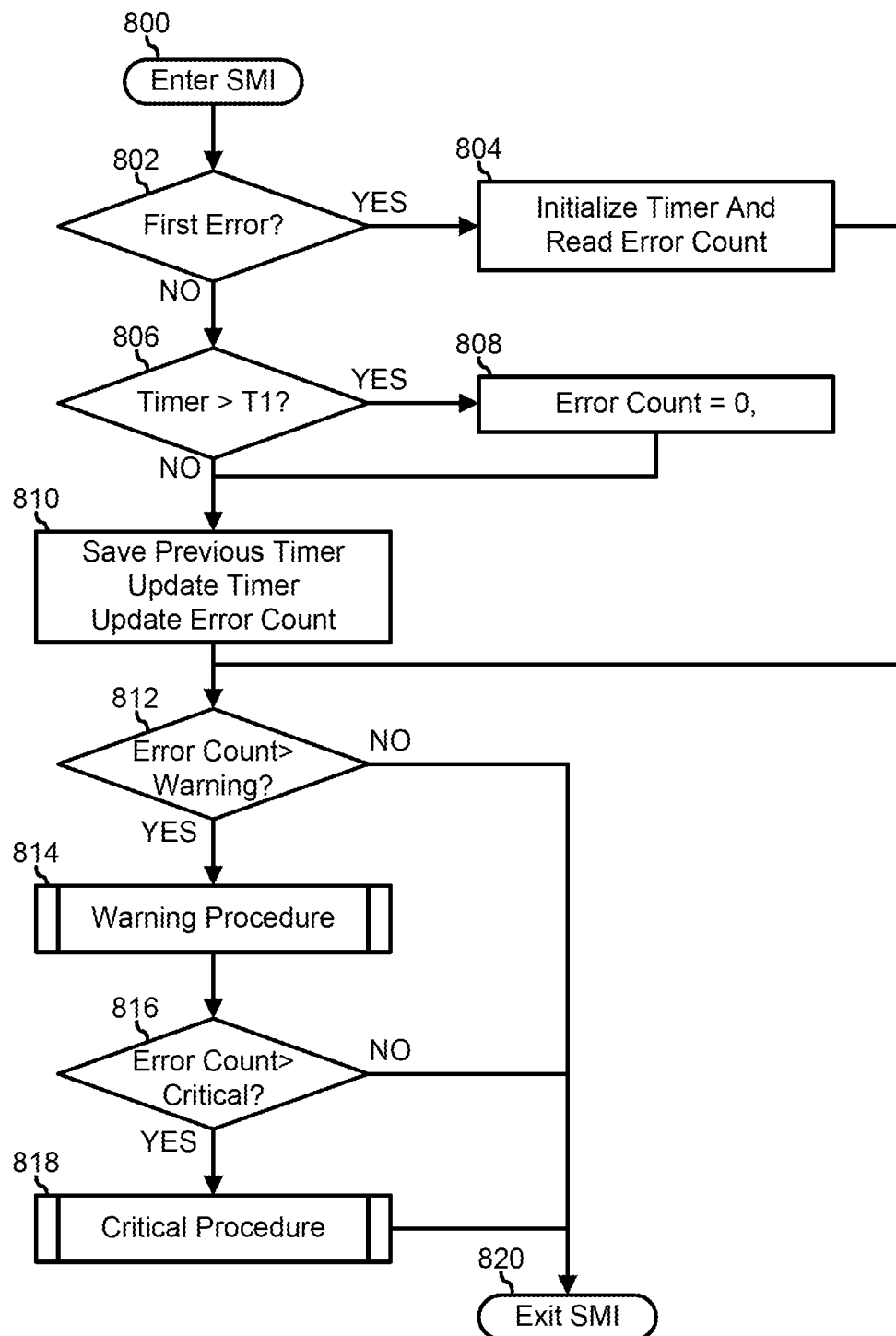
FIGS. 10-12 provide a flowchart illustrating another method for controlling memory failure handling in a DIMM of the information handling system of FIG. 6.

FIGS. 10-129 illustrate a method for controlling memory failure handling starting at block 800, where a correctable error interrupt has been received and an interrupt handler has invoked a failure predictor to implement the leaky-bucket algorithm. A decision is made as to whether or not the correctable error was a first correctable error in decision block 802. When the correctable error was the first correctable error, the "YES" branch of decision block 802 is taken and a timer, a read error count are initialized in block 804, and the method proceeds to decision block 812 where a decision is made as to whether or not the read error count is greater than a warning threshold. Since the correctable error was the first correctable error, the "NO" branch of decision block 812 is taken and the interrupt handler exits the method in block 820.

When the correctable error was not the first correctable error, the "NO" branch of decision block 802 is taken and a decision is made as to whether or not the timer value is less than a leak rate (T1) in decision block 806. If so the "YES" branch of decision block 806 is taken and the read error count is set to zero (0) in block 808, and the method proceeds to block 810 as described below. If the timer value is not less than the leak rate, the "NO" branch of decision block 806 is taken and the method proceeds to block 810. When the "NO" branch of decision block 806 is taken, or when the read error is set in block 808, the pervious timer value is saved, the timer is updated, and the read error count is incremented in block 810.

Figure 11:
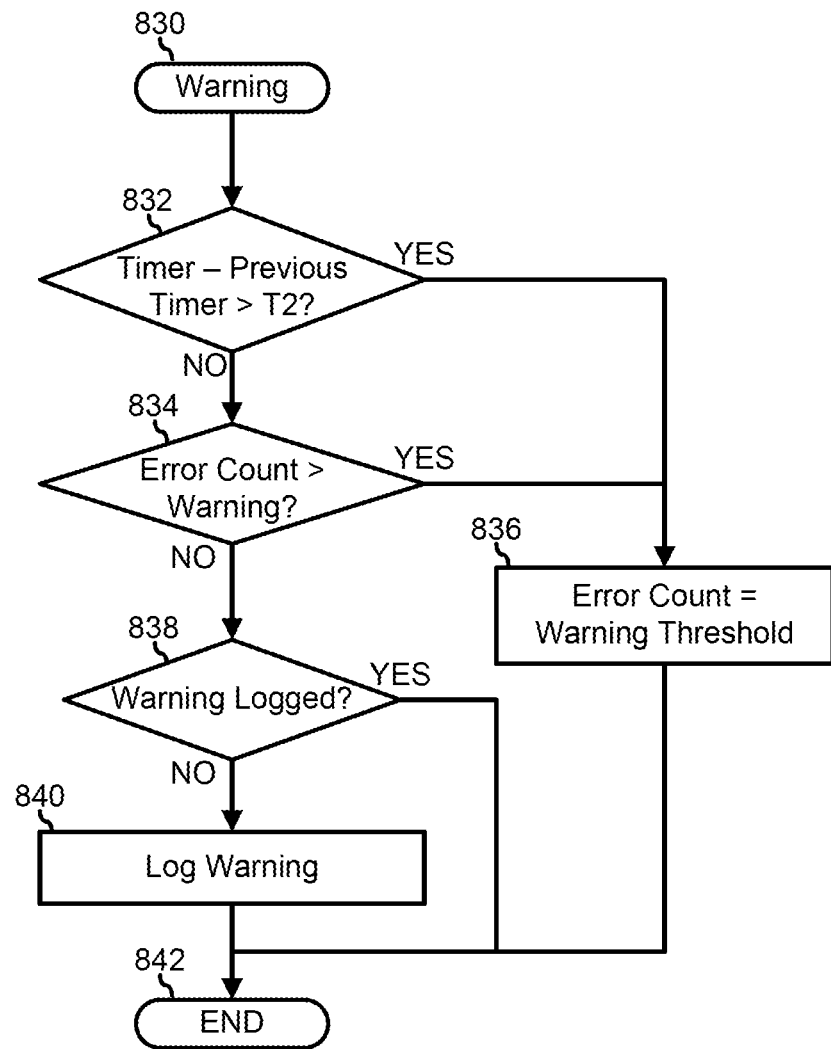

A decision is made as to whether or not the read error count value is greater than a warning threshold in decision block 812. If not, the "NO" branch of decision block 812 is taken and the interrupt handler exits the method in block 820. If the read error count value is greater than the warning threshold, the "YES" branch of decision block 812 is taken and a warning procedure 814 is performed, as shown in FIG. 11 and described below, and a decision is made as to whether or not the read error count value is greater than a critical threshold in decision block 816. If not, the "NO" branch of decision block 816 is taken and the interrupt handler exits the method in block 820. If the read error count value is greater than the critical threshold, the "YES" branch of decision block 816 is taken, a critical procedure 818 is performed, as shown in FIG. 12 and described below, and the interrupt handler exits the method in block 820.

FIG. 11 illustrates warning procedure 814 starting at block 830. A decision is made as to whether or not a difference between the previous timer, saved at block 810, and the current timer, updated at block 810, is greater than a suspend duration (T2) in decision block 832. If so, the "YES" branch of decision block 832 is taken, the error count is set to equal the warning threshold in block 836, and the method ends in block 842. If the difference between the previous timer and the current timer is not greater than the suspend duration (T2), the "NO" branch of decision block 832 is taken and a decision is made as to whether or not the error count is grater than the warning threshold in decision block 834. If so, the "YES" branch of decision block 834 is taken, the error count is set to equal the warning threshold in block 836, and the method ends in block 842. If the error count is not grater than the warning threshold, the "NO" branch of decision block 834 is taken and a decision is made as to whether or not the warning event has been logged in decision block 838. If not, the "NO" branch of decision block 838 is taken, the warning is logged in block 840, and warning procedure 814 ends in block 842. If the warning event has been logged, the "YES" branch of decision block 838 is taken and warning procedure 814 ends in block 842.

Figure 12:
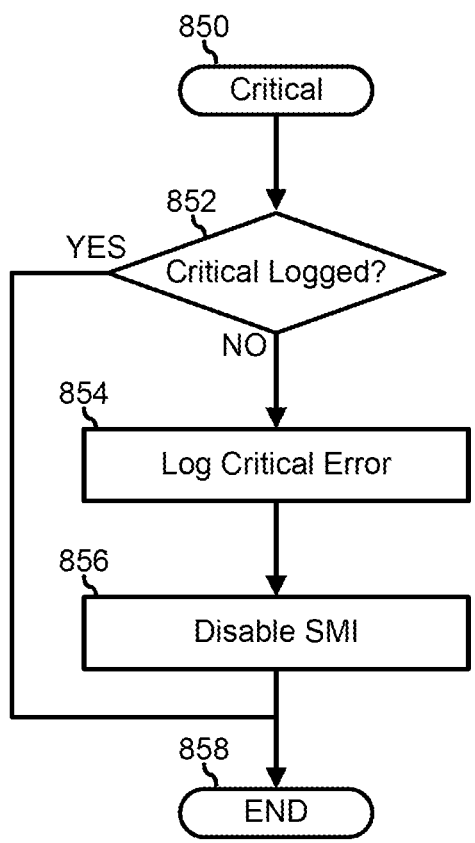

FIG. 12 illustrates critical procedure 818 starting at block 850. A decision is made as to whether or not the warning event has been logged in decision block 852. If not, the "NO" branch of decision block 852 is taken and critical procedure 818 ends in block 860. If the warning event has been logged, the "YES" branch of decision block 852 is taken and a decision is made as to whether or not the critical event has been logged in decision block 854. If so, the "YES" branch of decision block 854 is taken and critical procedure 818 ends in block 860. If the critical event has not been logged, the "NO" branch of decision block 854 is taken, the critical event is logged in block 856, further interrupts are disabled in block 858, and critical procedure 818 ends in block 860.

Figure 13:
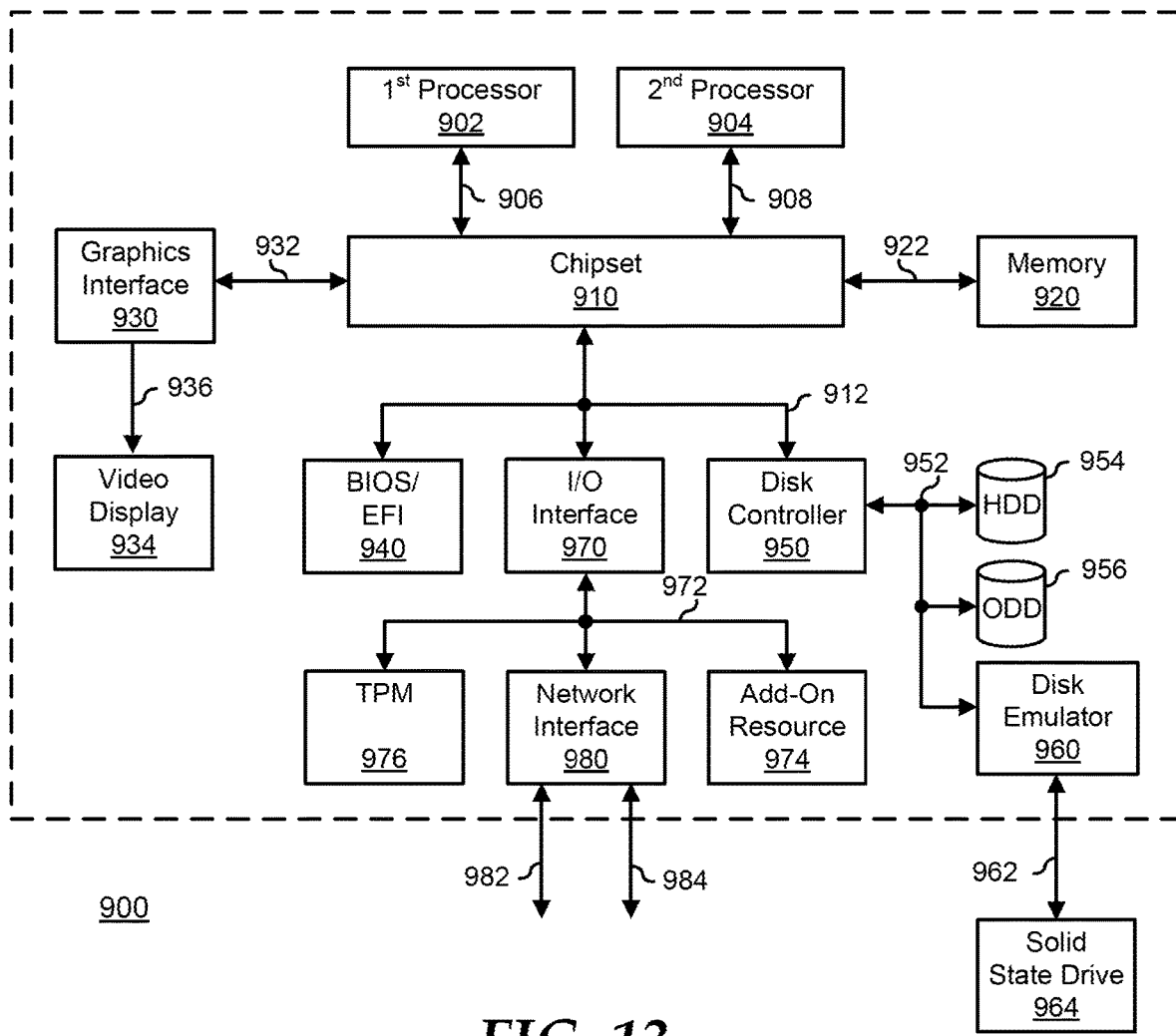
FIG. 13 is a block diagram illustrating a generalized information handling system according to an embodiment of the present disclosure.

FIG. 13 illustrates a generalized embodiment of an information handling system 900 similar to information handling system 100. For purpose of this disclosure information handling system 900 can be configured to provide the features and to perform the functions as described herein. Information handling system 900 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 900 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 900 can include processing resources for executing machine-executable code, such as a central processing unit (CPU), a programmable logic array (PLA), an embedded device such as a System-on-a-Chip (SoC), or other control logic hardware. Information handling system 900 can also include one or more computer-readable medium for storing machine-executable code, such as software or data. Additional components of information handling system 900 can include one or more storage devices that can store machine-executable code, one or more communications ports for communicating with external devices, and various input and output (I/O) devices, such as a keyboard, a mouse, and a video display. Information handling system 900 can also include one or more buses operable to transmit information between the various hardware components.

Information handling system 900 can include devices or modules that embody one or more of the devices or modules described below, and operates to perform one or more of the methods described below. Information handling system 900 includes a processors 902 and 904, a chipset 910, a memory 920, a graphics interface 930, a basic input and output system/universal extensible firmware interface (BIOS/UEFI) module 940, a disk controller 950, a hard disk drive (HDD) 954, an optical disk drive (ODD) 956, a disk emulator 960 connected to an external solid state drive (SSD) 962, an input/output (I/O) interface 970, one or more add-on resources 974, a trusted platform module (TPM) 976, a network interface 980, a management device 990, and a power supply 995. Processors 902 and 904, chipset 910, memory 920, graphics interface 930, BIOS/UEFI module 940, disk controller 950, HDD 954, ODD 956, disk emulator 960, SSD 962, I/O interface 970, add-on resources 974, TPM 976, and network interface 980 operate together to provide a host environment of information handling system 900 that operates to provide the data processing functionality of the information handling system. The host environment operates to execute machine-executable code, including platform BIOS/UEFI code, device firmware, operating system code, applications, programs, and the like, to perform the data processing tasks associated with information handling system 900.

In the host environment, processor 902 is connected to chipset 910 via processor interface 906, and processor 904 is connected to the chipset via processor interface 908. Memory 920 is connected to chipset 910 via a memory bus 922. Graphics interface 930 is connected to chipset 910 via a graphics interface 932, and provides a video display output 936 to a video display 934. In a particular embodiment, information handling system 900 includes separate memories that are dedicated to each of processors 902 and 904 via separate memory interfaces. An example of memory 920 includes random access memory (RAM) such as static RAM (SRAM), dynamic RAM (DRAM), non-volatile RAM (NV-RAM), or the like, read only memory (ROM), another type of memory, or a combination thereof.

BIOS/UEFI module 940, disk controller 950, and I/O interface 970 are connected to chipset 910 via an I/O channel 912. An example of I/O channel 912 includes a Peripheral Component Interconnect (PCI) interface, a PCI-Extended (PCI-X) interface, a high speed PCI-Express (PCIe) interface, another industry standard or proprietary communication interface, or a combination thereof. Chipset 910 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 940 includes BIOS/UEFI code operable to detect resources within information handling system 900, to provide drivers for the resources, initialize the resources, and access the resources. BIOS/UEFI module 940 includes code that operates to detect resources within information handling system 900, to provide drivers for the resources, to initialize the resources, and to access the resources.

Disk controller 950 includes a disk interface 952 that connects the disk controller to HDD 954, to ODD 956, and to disk emulator 960. An example of disk interface 952 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 960 permits SSD 964 to be connected to information handling system 900 via an external interface 962. An example of external interface 962 includes a USB interface, an IEEE 1384 (Firewire) interface, a proprietary interface, or a combination thereof. Alternatively, solid-state drive 964 can be disposed within information handling system 900.

I/O interface 970 includes a peripheral interface 972 that connects the I/O interface to add-on resource 974, to TPM 976, and to network interface 980. Peripheral interface 972 can be the same type of interface as I/O channel 912, or can be a different type of interface. As such, I/O interface 970 extends the capacity of I/O channel 912 when peripheral interface 972 and the I/O channel are of the same type, and the I/O interface translates information from a format suitable to the I/O channel to a format suitable to the peripheral channel 972 when they are of a different type. Add-on resource 974 can include a data storage system, an additional graphics interface, a network interface card (NIC), a sound/video processing card, another add-on resource, or a combination thereof. Add-on resource 974 can be on a main circuit board, on separate circuit board or add-in card disposed within information handling system 900, a device that is external to the information handling system, or a combination thereof.

Network interface 980 represents a NIC disposed within information handling system 900, on a main circuit board of the information handling system, integrated onto another component such as chipset 910, in another suitable location, or a combination thereof. Network interface device 980 includes network channels 982 and 984 that provide interfaces to devices that are external to information handling system 900. In a particular embodiment, network channels 982 and 984 are of a different type than peripheral channel 972 and network interface 980 translates information from a format suitable to the peripheral channel to a format suitable to external devices. An example of network channels 982 and 984 includes InfiniBand channels, Fibre Channel channels, Gigabit Ethernet channels, proprietary channel architectures, or a combination thereof. Network channels 982 and 984 can be connected to external network resources (not illustrated). The network resource can include another information handling system, a data storage system, another network, a grid management system, another suitable resource, or a combination thereof.

Management device 990 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 900. In particular, management device 990 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 900, such as system cooling fans and power supplies. Management device 990 can include a network connection to an external management system, and the management device can communicate with the management system to report status information for information handling system 900, to receive BIOS/UEFI or system firmware updates, or to perform other task for managing and controlling the operation of information handling system 900. Management device 990 can operate off of a separate power plane from the components of the host environment so that the management device receives power to manage information handling system 900 when the information handling system is otherwise shut down. An example of management device 990 may include a commercially available BMC product that operates in accordance with an Intelligent Platform Management Initiative (IPMI) specification, such as a Integrated Dell Remote Access Controller (iDRAC), or the like. Management device 990 may further include associated memory devices, logic devices, security devices, or the like, as needed or desired.

Power supply 995 represents one or more devices for power distribution to the components of information handling system 900. In particular, power supply 995 can include a main power supply that receives power from an input power source, such as a wall power outlet, a power strip, a battery, or another power source, as needed or desired. Here, power source 995 operates to convert the power at a first voltage level from the input power source to one or more power rails that are utilized by the components of information handling system. Power supply 995 can also include one or more voltage regulators (VRs) that each receive power from the main power supply and that operate to convert the input voltage to an output voltage that is used by one or more components of information handling system. For example, a VR can be provided for each of processors 902 and 904, and another VR can be provided for memory 920. Power supply 995 can be configured to provide a first power plane that provides power to the host environment, and to provide a second power plane that provides power to the management environment.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
a processor;
a dual in-line memory module (DIMM); and
a memory controller coupled to the DIMM, the memory controller configured to provide interrupts to the processor each time a read transaction from the DIMM results in a correctable read error;
wherein the processor is configured to instantiate a failure predictor, the failure predictor to receive the interrupts, to accumulate a count of the interrupts, and to provide a first error indication when the count exceeds a first error threshold, wherein in accumulating the count, the failure predictor increments the count each time the predictor receives a particular interrupt and decrements the count in accordance with an error leak rate, and wherein the error leak rate has a first value when the DIMM is newer than a first age threshold and has a second value when the DIMM is older than the first age threshold.

2. The information handling system of claim 1, wherein the DIMM includes a date code that provides a manufacture date of the DIMM.

3. The information handling system of claim 2, wherein the failure predictor is further to read the date code from the DIMM, and to determine that the DIMM is newer or older than the first age threshold based upon the date code.

4. The information handling system of claim 1, wherein the memory controller includes an installation date for the DIMM.

5. The information handling system of claim 4, wherein the failure predictor is further to read the installation date from the memory controller, and to determine that the DIMM is newer or older than the first age threshold based upon the installation date.

6. The information handling system of claim 1, wherein the failure predictor is further to provide a second error indication when the count exceeds a second error threshold, the second threshold higher than the first error threshold.

7. The information handling system of claim 1, wherein the error leak rate further maintains the second value when the DIMM is newer than a second age threshold and has a third value when the DIMM is older than the second age threshold, wherein the second age threshold specifies an older age than the first age threshold.

8. The information handling system of claim 1, wherein the first value of the error leak rate provides a faster leak rate than the second value of the leak rate.

9. The information handling system of claim 1, wherein the failure predictor is included in an interrupt handler of the information handling system.

10. A method of controlling memory failure handling, the method comprising:
providing, by a memory controller of an information handling system, interrupts to a processor of the information handling system each time a read transaction between the memory controller and a dual in-line memory module (DIMM) of the information handling system results in a correctable read error;

receiving, by a failure predictor instantiated by the processor, the interrupts;

accumulating, by the failure predictor, a count of the interrupts; and providing, by the failure predictor, a first error indication when the count exceeds a first error threshold;

wherein the accumulating further includes:
incrementing the count each time the predictor receives a particular interrupt; and
decrementing the count in accordance with an error leak rate, wherein the error leak rate has a first value when the DIMM is newer than a first age threshold and has a second value when the DIMM is older than the first age threshold.

11. The method of claim 10, wherein the DIMM includes a date code that provides a manufacture date of the DIMM.

12. The method of claim 11, further comprising:
reading, by the failure predictor, the date code from the DIMM; and
determining, by the failure predictor, that the DIMM is newer or older than the first age threshold based upon the date code.

13. The method of claim 10, wherein the memory controller includes an installation date for the DIMM.

14. The method of claim 13, further comprising:
reading, by the failure predictor, the installation date from the memory controller; and
determining, by the failure predictor, that the DIMM is newer or older than the first age threshold based upon the installation date.

15. The method of claim 10, further comprising:
providing, by the failure predictor, a second error indication when the count exceeds a second error threshold, the second threshold higher than the first error threshold.

16. The method of claim 10, wherein the error leak rate further maintains the second value when the DIMM is newer than a second age threshold and has a third value when the DIMM is older than the second age threshold, wherein the second age threshold specifies an older age than the first age threshold.

17. The method of claim 10, wherein the first value of the error leak rate provides a faster leak rate than the second value of the leak rate.

18. The method of claim 10, wherein the failure predictor is included in an interrupt handler of the information handling system.

19. An information handling system, comprising:
a processor;
a hardware management engine;
a dual in-line memory module (DIMM); and
a memory controller coupled to the DIMM, the memory controller including a count of a number of times a read transaction from the DIMM resulted in a correctable read error;
wherein the hardware management engine is configured to instantiate a failure predictor to retrieve a first number of correctable read errors from the memory controller, to determine a difference between the first number of correctable read errors and a second number of correctable read errors retrieved by the failure predictor, to adjust the difference in accordance with an error leak rate, and to provide an interrupt to the processor when the adjusted difference exceeds an error threshold, wherein the error leak rate has a first value when the DIMM is newer than a first age threshold and has a second value when the DIMM is older than the first age threshold.

20. The information handling system of claim 19, wherein:
the memory controller includes a read counter that provides a number of read operations the memory controller has performed on the DIMM; and
the failure predictor is further to read the read counter from the memory controller.

* * * * *